(12) United States Patent
Augustin et al.

(10) Patent No.: US 6,809,937 B2
(45) Date of Patent: Oct. 26, 2004

(54) METHOD AND APPARATUS FOR SHOCK AND VIBRATION ISOLATION OF A CIRCUIT COMPONENT

(75) Inventors: Thomas J. Augustin, El Dorad Hills, CA (US); Christopher G. Malon, Folsom, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 09/990,819

(22) Filed: Nov. 16, 2001

(65) Prior Publication Data

US 2003/0093897 A1 May 22, 2003

(51) Int. Cl.$^7$ ................................................. H02B 1/01
(52) U.S. Cl. ........................ 361/832; 361/784; 361/810; 174/256; 174/259; 257/712; 257/717
(58) Field of Search ................................. 361/832, 807, 361/784, 810, 737; 174/255, 256, 259; 257/713, 717, 712

(56) References Cited

U.S. PATENT DOCUMENTS

| | | | |
|---|---|---|---|
| 4,164,003 A | | 8/1979 | Cutchaw |
| 4,545,610 A | | 10/1985 | Lakritz et al. |
| 4,581,680 A | | 4/1986 | Garner |
| 4,886,571 A | | 12/1989 | Suzuki et al. |
| 5,103,292 A | * | 4/1992 | Mahulikar .................. 257/697 |
| 5,222,014 A | | 6/1993 | Lin |
| 5,239,198 A | | 8/1993 | Lin et al. |
| 5,244,143 A | | 9/1993 | Ference |
| 5,541,450 A | | 7/1996 | Jones et al. |
| 5,557,503 A | | 9/1996 | Isaacs |
| 5,587,882 A | * | 12/1996 | Patel .......................... 361/705 |
| 5,615,735 A | | 4/1997 | Yoshida |
| 5,719,746 A | * | 2/1998 | Ohbuchi et al. ............. 361/737 |

(List continued on next page.)

OTHER PUBLICATIONS

Thomas P. Dolbear et al., Effect of Mechanical Shock and Vibration on the Second–level Temperature Cycling Reliability of Ceramic Ball Grid Arrays with a Continuous Compressive Load Applied, 5 unnumbered pages.
R. Bargerhuff et al., Development of a Large Heatsink Support Structure, 12 unnumbered pages.
Jeffrey L. Deeney et al., patent application filed on Nov. 16, 2001 titled Method And Apparatus of Supporting Circuit Component Having A Solder Column Array Using Interspersed Rigid Columns, pp. 1–9 and 1 sheet of drawings.
Jeffrey L. Deeney, patent application filed on Nov. 16, 2001 titled Method And Apparatus For Supporting Circuit Component Having Solder Column Array Interconnects Using Interposed Support Shims, pp. 1–13 and 1 sheet of a drawing.
Jeffrey L. Deeney et al., patent application filed on Nov. 16, 2001 titled Method And Apparatus For Supporting A Circuit Component Having A Solder Column Interconnects Using An External Support, pp. 1–15 and 2 sheets of drawings.

*Primary Examiner*—David Martin
*Assistant Examiner*—Hung S. Bui

(57) ABSTRACT

An apparatus for improved shock and vibration isolation of a CGA integrated package which utilizes solder column grid arrays to provide electrical connection to a printed circuit board. The CGA integrated package includes a substrate and a package lid. A support frame is attached at an attachment point to the substrate or the package lid of the CGA integrated package and at a second attachment point to the printed circuit board. An isolation material, such as Styrofoam or Sorbathane is located at the attachment point of the support frame to the substrate or the package lid, or located at the second attachment point of the support frame to the circuit board such that a vibration or shock to the circuit board must travel through the isolation material at the attachment point prior to reaching the integrated circuit. A method of supporting an integrated circuit on a circuit board and improving the isolation of an integrated circuit from any vibration and shock to the circuit board is also provided.

13 Claims, 2 Drawing Sheets

U.S. PATENT DOCUMENTS

| | | | |
|---|---|---|---|
| 5,793,106 A | * 8/1998 | Yasukawa et al. | ........... 257/712 |
| 5,805,427 A | 9/1998 | Hoffman | |
| 5,905,636 A | 5/1999 | Baska et al. | |
| 5,926,370 A | 7/1999 | Cromwell | |
| 5,956,576 A | 9/1999 | Toy et al. | |
| 5,978,229 A | 11/1999 | Kim | |
| 5,990,418 A | 11/1999 | Bivona et al. | |
| 6,061,235 A | 5/2000 | Cromwell | |
| 6,084,178 A | 7/2000 | Cromwell | |
| 6,165,817 A | * 12/2000 | Akram et al. | ................ 438/118 |
| 6,198,630 B1 | 3/2001 | Cromwell | |
| 6,231,333 B1 | 5/2001 | Gruber | |
| 6,235,996 B1 | 5/2001 | Farooq | |
| 6,276,596 B1 | 8/2001 | Gruber | |
| 6,282,096 B1 | * 8/2001 | Lo et al. | ...................... 361/704 |
| 6,424,533 B1 | * 7/2002 | Chu et al. | ................... 361/719 |

* cited by examiner

METHOD AND APPARATUS FOR SHOCK AND VIBRATION ISOLATION OF A CIRCUIT COMPONENT

FIELD OF THE INVENTION

This invention relates to circuit components mounted on circuit boards by solder column arrays, and more particularly, to column grid arrays and a method of supporting them.

BACKGROUND OF THE INVENTION

Solder column arrays are used to interconnect circuit packages to circuit boards, most typically large ceramic integrated circuit packages. One such package is the column grid array package (CGA) that has a ceramic substrate with an array of solder columns that extend out from it, typically from the bottom surface. The solder columns are attached at one end to connection pads or locations on the ceramic substrate. The solder columns are sufficiently tall so that when the circuit package is placed on a circuit board, the solder columns can accommodate the difference in thermal expansion between the ceramic integrated circuit package and the printed circuit board. The solder columns are soldered to respective pads on the circuit board using known techniques, such as a convection reflow solder process.

One problem with solder column arrays is that the solder columns do not withstand compressive force, vibration, or shock well. The solder columns in the solder column arrays are made of approximately ninety percent eutectic solder, which is a soft material. Moreover, the individual solder columns are very thin. Consequently, if any significant amount of compressive force, vibration or shock is applied to the circuit package the solder column array may compress or otherwise weaken or deteriorate, particularly over time, which may compromise reliability. Thus, it is desirable to provide a mechanism to reduce the force, shock or vibration which may impact the CGA integrated circuit.

SUMMARY OF THE INVENTION

In one aspect of the present invention, an apparatus for improved shock and vibration isolation of a circuit component utilizing solder column grid arrays to provide electrical connection to a base component is provided. The apparatus includes a support frame attached to the circuit component and to the base component which supports the circuit component on the base component. Also included is an isolation material located at a point between the circuit component and the base component such that a vibration or shock to the base component must travel through the isolation material prior to reaching the integrated circuit. The point where the isolation material is provided between the circuit component and the base component is preferably at least one of the points between the support frame and the circuit component, between the support frame and the base component, or between two components of the support frame.

In another aspect of the present invention, an apparatus for improved shock and vibration isolation of a CGA integrated package which utilizes solder column grid arrays to provide electrical connection to a circuit board and which includes a substrate and a package lid is provided. The apparatus includes a support frame attached at an attachment point to the substrate or the package lid of the integrated package and at a second attachment point to the circuit board. Also included is an isolation material located at the attachment point of the support frame to the substrate or the package lid, or located at the second attachment point of the support frame to the circuit board such that a vibration or shock to the circuit board must travel through the isolation material at the attachment point prior to reaching the integrated circuit.

In another aspect of the present invention, a method of supporting a circuit component on a base component and improving the isolation of the circuit component from any vibration and shock to the base component is provided. The method includes the step of providing a support frame which supports the circuit component and attaches the circuit component to the base component. Also included is the step of providing an isolation material at a point between the circuit component and the base component such that a shock or vibration to the base component must pass through the isolation material before reaching the circuit component.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings wherein.

DETAILED DESCRIPTION OF THE PREFERRED EMBODIMENTS

The following description of the preferred embodiment(s) is merely exemplary in nature and is in no way intended to limit the invention, its application, or uses. For example, it should be understood that while the invention is described as implemented in CGA integrated circuit package, it is not limited to CGA integrated circuit packages and can be utilized on any circuit package having a solder column array. Additionally, e.g., CGA integrated circuit package can be a CPU package but can also be other types of circuit packages, such as ASICs (application specific integrated circuits).

Figure 1:
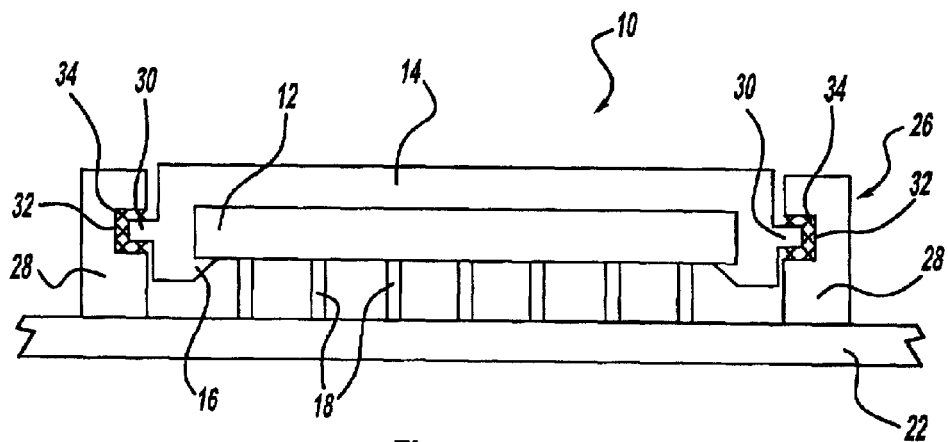
FIG. 1 is a side view of a column grid array integrated package mounted on a circuit board and having an external support frame of a preferred embodiment in accordance with the invention.

Referring to FIG. 1, a CGA integrated circuit package 10 having an external support frame 26 of a preferred embodiment in accordance with the invention is shown. CGA integrated circuit package 10 has a ceramic substrate 12 and a package lid 14. The package lid 14 extends around the ceramic substrate and includes locking tabs 16 which insure a solid connection between these two components. A solder column array having an array of solder columns 18 extends from a bottom side of ceramic substrate 12. When CGA integrated circuit package 10 is mounted on a circuit board 22, solder columns 18 of solder column array are soldered to respective connection pads on circuit board 22, which is illustratively a printed circuit board.

An external support frame 26 is attached to the generally square CGA integrated circuit package 10. The external frame of this embodiment is made up of two elongated members 28. The members 28 are arranged on opposing sides of the CGA integrated package 10. Of course, many alternative arrangements are possible. For example, the support frame 26 may include four elongated members 28 with each one arranged along a corresponding side of the CGA integrated package 10. The members along different sides of the CGA integrated package 10 may be interconnected to each other through attachment members or may be completely separate components. Similarly, support frame 26 may include a plurality of shorter members along each side of the CGA integrated package 10 which may or may not be interconnected to each other. Each support member 28 is attached to the printed circuit board 22 by screws (not seen) although any satisfactory attachment means may be utilized, including, e.g., a snap-fit clip structure, adhesives, forming as a single integral component, etc.

Along the opposing sides of the CGA integrated package 10 to a protrusion 30 is provided. As illustrated, the protrusion 30 is an elongated rib which extends the entire length of the side of the CGA integrated package 10. A corresponding recess 32 is provided in each frame member 28. The protrusion 30 of the package lid 14 and the corresponding recess 32 of the frame member 26 cooperate to support the CGA integrated package 10. Of course, the location of the protrusion 30 and the recess 32 can be reversed so that the protrusion 30 is associated with the support frame 26 and the recess 32 is associated with the CGA integrated package 10.

Importantly, a shock and/or vibration isolation material 34 is provided in this embodiment between the protrusion 30 of the CGA integrated package 10 and the walls of the recess 32 of the support frame 26. This isolation material 34 dampens any vibration or shock which may be occurring to the printed circuit board 22 to minimize or eliminate its transfer to the CGA integrated circuit package 10. This isolation material 34 may be any material and or structure known for its vibration and/or shock dampening properties.

Exemplary preferred isolation materials 34 include polystyrene, visco-elastic polymer, and thermo set polyether-based polyurethane. Certain of these materials are sold under the trade names Styrofoam and Sorbathane. In addition, various isolation materials 34 having a honeycombed or other closed cell or open cell internal structure may be utilized. In fact, the isolation material 34 may be made of a material where the material per se is not known for its shock or vibration dampening properties, but which is constructed in such a way that it offers these properties (e.g., a foamed plastic layer including a plurality of air pockets). Also expanding foam materials such as those commonly used in packaging and insulation applications, may comprise the isolation material 34. This material may be advantageous due to its ability to generate a tight fit and/or a biasing force against components; particularly when it is foamed into a space that is sealed during the foam formation process.

Figure 2:
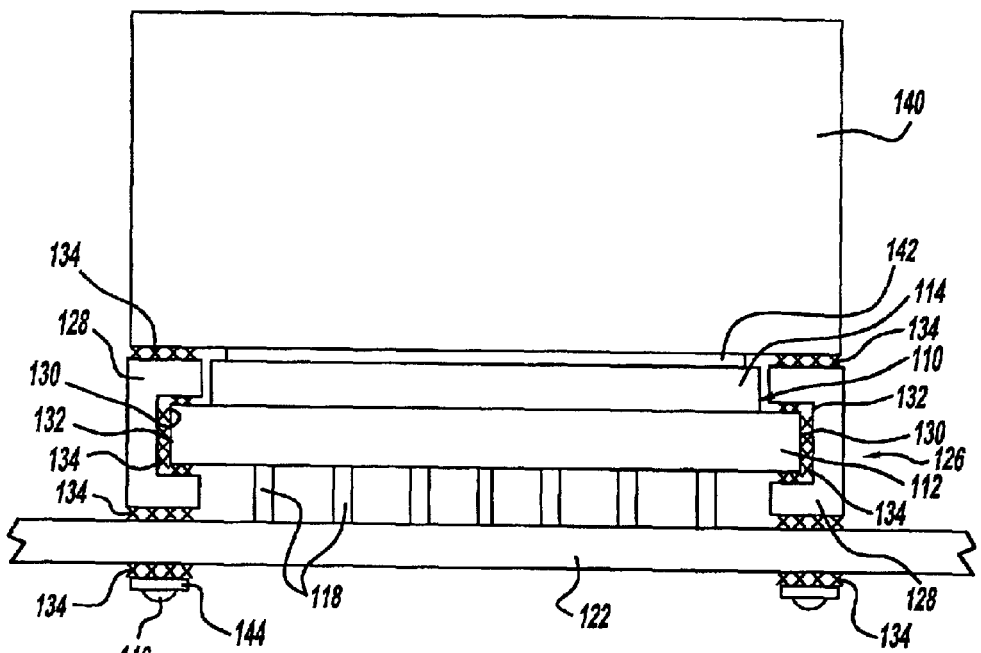
FIG. 2 a side view of a column grid array integrated package mounted on a circuit board and having an external support frame of an alternative preferred embodiment in accordance with the invention.

The isolation material 34 preferably maintains its shock and/or vibration isolation properties when subjected to the loads present in supporting a heat sink 140 as seen, e.g., in FIG. 2 on the CGA integrated circuit package 110. Thus, the isolation material 34, in combination with the configuration of the cooperating support components such as the protrusion 30 and recess 32, is capable of supporting the weight exerted thereon by the CGA integrated package 10 and components which may be located on the CGA integrated package 10 without being damaged or losing its shock and/or vibration isolation properties. Thus, the support frame 26 along with the isolation material 34 provides support for the CGA integrated package 10 in a way that it is not subjected to detrimental force, shock and/or vibration which would harm the CGA integrated package 10 or its connection to the circuit board 22 via the solder column 18 array.

Thus, the isolation material 34 of FIG. 1 is located at a point between the circuit component, i.e., in this case the CGA integrated package 10, and the base component, i.e., in this case the printed circuit board 22. More specifically, the isolation material 34 is provided between the package lid 14 of the CGA integrated package 10 and the support frame 26. The isolation material 34 is provided such that a vibration or shock to the circuit board 22 must travel through the isolation material 34 prior to reaching the integrated circuit 10. As discussed herein, the effect of a vibration or shock traveling through the solder column 18 grid array is ignored.

Referring to FIG. 2, a heat sink 140 is illustrated mounted upon an alternative support frame 126 and CGA integrated package 110. The heat sink 140 includes an integral elevating platform 142 which is mounted on top of the CGA integrated package 110 to dissipate heat therefrom. Any known mounting means may be utilized. For example, the heat sink 140 may simply be adhesively attached to the top surface of the package lid 114 using a thermally conductive adhesive.

Additionally, many alternative known mounting means include a biasing force to hold the heat sink 140 in contact with the upper surface of the CGA integrated circuit 110. Many mounting means also include a bolster plate (not shown) attached to the bottom side of the circuit board 122 to add rigidity thereto. One such exemplary mounting means is disclosed in U.S. Pat. No. 6,198,630 which issued to Cromwell on Mar. 6, 2001 and is assigned to the Hewlett-Packard Company. As will be readily apparent to those skilled in the art, such components may easily be utilized with the support frame 126 of the present invention.

With continued reference to FIG. 2, another preferred support frame 126 is provided. In this embodiment the substrate 112 extends past the sides of the package lid 114. The support frame 126 includes a channel 132 similar to the above embodiment which surrounds the edges of the substrate. Again, an isolation material 134 is located between the cooperating parts 130, 132 of the substrate 112 and the support frame 126. In addition, an isolation material 134 is provided between the bottom of the support member 128 and the printed circuit board 122. Isolation material 134 is also provided between a washer 144 for the screw 146 and the bottom of the printed circuit board 122.

Additionally, an isolation material 134 is also provided between the top of the support frame 126 and the bottom of the heat sink 140. This enables the support frame 126 to also provide support for at least a portion of the downward force of the heat sink 140. Thus, the entire weight of the heat sink 140 is not transferred to the circuit board 122 through the CGA integrated package 110. Supporting the entire weight of the heat sink 140, including any biasing force, by the substrate 112 could cause damage to the circuitry of the CGA integrated package 110. The utilization of isolation materials 134 in several locations as illustrated in this embodiment provides significant isolation from shocks and/or vibrations. It should be noted that the isolation materials 134 not be the same material at each location described above.

Figure 3:
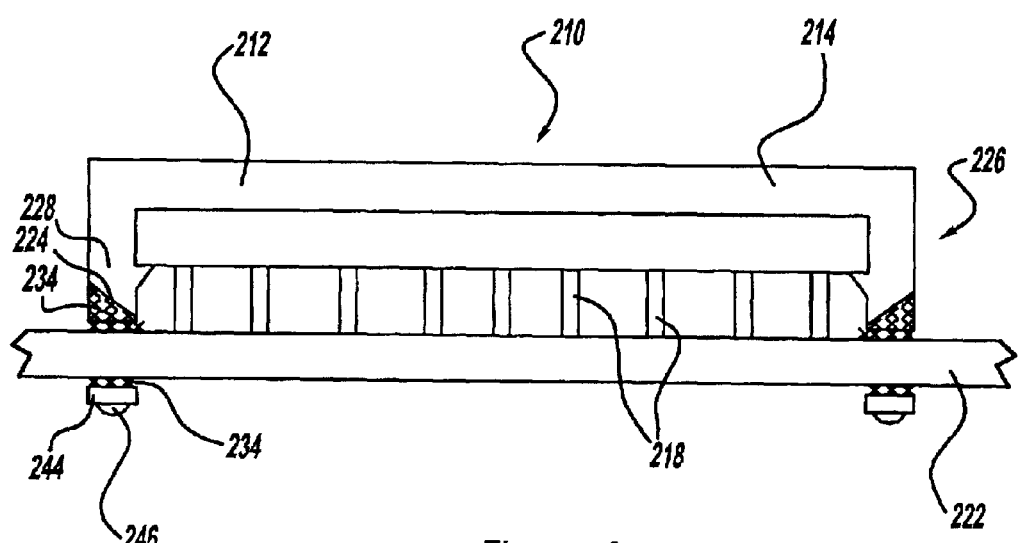
FIG. 3 is a side view of a column grid array integrated package mounted on a circuit board and having an external support frame of a second alternative preferred embodiment in accordance with the invention.

Thus, the apparatus of FIG. 3 utilizes an isolation material 134 at a plurality of points between the circuit component 110 and the base component 122. Specifically, an isolation material 134 is provided between the support frame 126 and the circuit board 122; both on top of the circuit board 122 and under the circuit board 122 between it and the washer 144 of the attachment screw 146. Isolation material 134 is also provided between the substrate 112 of the CGA integrated circuit 110 and the support frame 126. In both cases, the isolation material 134 is provided such that a vibration or shock the base component 122 must travel through the isolation material 134 prior to reaching the integrated circuit 110.

In addition, isolation material 134 is provided at a point between the support frame 126 and an additional component, i.e., in this case the heat sink 140. This isolation material 134 is provided such that a vibration or shock occurring to the heat sink 140 is dampened prior to reaching the CGA integrated package 110 verses the situation where the isolation material 134 is not present.

Referring to FIG. 3, yet another preferred embodiment is provided. In this version the support frame 226 is integrally formed with the CGA integrated package 210; specifically, the package lid 214 thereof. It may be preferred to leave the support frame 226 unattached to the printed circuit board 222 until after the solder column 218 array is formed and attached to the board 222. As such, the isolation material 234 is not inserted until later. To insure a tight fit in these circumstances the bottom surface 229 of the frame support member 228 may include an inward taper as shown. Similarly, the isolation material 234 may have a triangular cross-sectional shape. Thus, the isolation material 234 may operate as a wedge upon insertion to insure a tight and solid fit capable of providing the necessary support and isolation between the CGA integrated circuit package 210 and the printed circuit board 222.

Then the support frame 226 may be attached to the circuit board 222 via screws 246. Isolation material 234 is also provided between a washer 244 and the underside of the printed circuit board 222 for each screw 246 used to attach the support frame members 228 to the printed circuit board 222. Consequently, an isolation material 234 is provided at a point between the circuit component 210 and the base component 222 such that a vibration or shock to the base component 222 must travel through the isolation material 234 prior to reaching the integrated circuit 210. Alternatively, a similar structure may be provided at a point distant from the circuit board 222 such that the isolation material 234 is provided between two components of the support frame 236.

Many other variations for providing a supporting frame 226 which includes an isolation material 234 between two components to provide increased isolation from variations and shocks. For example, a rib 30, similar to that of FIG. 1 might extend off of the substrate 12 instead of the package lid 14. A rib 30 made up of central portions of both the lid 14 and substrate 12 together may be provided. As with each of the described embodiments, the support frame 26 is highly preferably constructed to provide support against both upward and a downward forces. However, this effect might also be achieved by utilizing an isolation material 34 which also has adequate adhesive properties in itself (e.g., expanding foams as mentioned above) or utilizes an adhesive to keep the isolation material 34 securely attached to the support frame and the CGA integrated circuit package.

As is readily apparent from the above discussion, a method of increasing the isolation of an integrated circuit 10 from vibration and shock is also provided. The method includes providing a support frame 26 which supports the weight of the CGA integrated package 10 and attaches the CGA integrated package 10 to a base component, such as a circuit board 22. In addition, the support frame 26 may provide support for other components, such as a heat sink 140.

Additionally, the method includes providing an isolation material 34 at a point between the integrated circuit 10 and the circuit board 22 such that a shock or vibration to the circuit board 22 must pass through the isolation material 34 before reaching the integrated circuit package 110. The method may include providing the isolation material 34 at a plurality of points along the path. The method may further include supporting other components, such as the heat sink 140 of FIG. 2, with the support frame 126 and providing isolation material 134 between, e.g., the heat sink 140 and the support frame 128, such that a shock or vibration must pass through the isolation material 134 as discussed above.

The description of the invention is merely exemplary in nature and, thus, variations that do not depart from the gist of the invention are intended to be within the scope of the invention. Such variations are not to be regarded as a departure from the spirit and scope of the invention. Accordingly, the present invention comprehends all embodiments within the scope of the appended claims.

What is claimed is:

1. An apparatus for improved shock and vibration isolation of a circuit component utilizing solder column grid arrays to provide electrical connection to a base component, the apparatus comprising:

(a) a support frame attached to the circuit component and to the base component which supports the circuit component on the base component; and (b) an isolation material located at a point between the circuit component and the base component such that a vibration or shock to the base component must travel through the isolation material prior to reaching the circuit component.

2. An apparatus for improved shock and vibration isolation of a circuit component according to claim 1, wherein the point between the circuit component and the base component is at least one of the points between the support frame and the circuit component, between the support frame and the base component.

3. An apparatus for improved shock and vibration isolation of a circuit component according to claim 1, wherein the isolation material is selected from the group consisting of polystyrene, visco-elastic polymer and thermo set polyether-based polyurethane.

4. An apparatus for improved shock and vibration isolation of a circuit component according to claim 1, wherein an isolation material is additionally provided between the support frame and an additional component.

5. An apparatus for improved shock and vibration isolation of a circuit component according to claim 1, wherein the circuit component includes a package lid and the isolation material is located at a point between the package lid and the support frame.

6. An apparatus for improved shock and vibration isolation of a circuit component according to claim 1, wherein the circuit component includes a substrate and the isolation material is located at a point between the substrate and a support frame.

7. An apparatus for improved shock and vibration isolation of a circuit component according to claim 1, wherein the circuit component includes a package lid, wherein the package lid or the support frame includes a protrusion which cooperates with a corresponding recess on the other of the package lid or the support frame, and wherein the isolation material is located between the protrusion and the recess.

8. An apparatus for improved shock and vibration isolation of a CGA integrated package which utilizes solder column grid arrays to provide electrical connection to a circuit board and which includes a substrate and a package lid, the apparatus comprising:

(a) a support frame attached at an attachment point to the substrate or the package lid of the integrated package and at a second attachment point to the circuit board; and (b) an isolation material located at the attachment point of the support frame to the substrate or the package lid, or located at the second attachment point of the support frame to the circuit board such that a vibration or shock to the circuit board must travel through the isolation material at the attachment point prior to reaching the integrated circuit.

9. An apparatus for improved shock and vibration isolation of a CGA integrated package according to claim 8 wherein the isolation material is located at both the attachment point of the support frame to the substrate or the package lid, and located at the second attachment point of the support frame to the circuit board such that a vibration or shock to the circuit board must travel through the isolation material at the attachment point prior to reaching the CGA integrated package.

10. An apparatus for improved shock and vibration isolation of an integrated package according to claim 8, wherein the isolation material is selected from the group consisting of polystyrene, visco-elastic polymer and thermo set polyether-based polyurethane.

11. An apparatus for improved shock and vibration isolation of a CGA integrated package according to claim 8, wherein the package lid or the support frame includes a protrusion which cooperates with a corresponding recess on the other of the package lid or the support frame, and wherein the isolation material is located between the protrusion and the recess.

12. An apparatus for improved shock and vibration isolation of a CGA integrated package according to claim 8, wherein an isolation material is additionally provided between the support frame and an additional component, and wherein the additional component is a heat sink.

13. An apparatus for improved shock and vibration isolation of a CGA integrated package according to claim 8, wherein the support frame is attached to the circuit board via a screw and the isolation material is located at a point between the screw and the circuit board.

* * * * *